United States Patent
Hung et al.

(10) Patent No.: US 9,550,270 B2
(45) Date of Patent: Jan. 24, 2017

(54) TEMPERATURE MODIFICATION FOR CHEMICAL MECHANICAL POLISHING

(71) Applicant: Taiwan Semiconductor Manufacturing Company Limited, Hsin-Chu (TW)

(72) Inventors: Jung-Lung Hung, Hsinchu (TW); Rong-June Hsiao, Tainan (TW); Chi-Hao Huang, Zhunan Township (TW); Hong-Hsing Chou, Jhubei (TW); Yeh-Chieh Wang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 167 days.

(21) Appl. No.: 13/955,356

(22) Filed: Jul. 31, 2013

(65) Prior Publication Data

US 2015/0038056 A1    Feb. 5, 2015

(51) Int. Cl.
*B24B 37/015* (2012.01)
*B24B 37/34* (2012.01)
*H01L 21/321* (2006.01)

(52) U.S. Cl.
CPC ............. *B24B 37/015* (2013.01); *B24B 37/34* (2013.01); *H01L 21/3212* (2013.01)

(58) Field of Classification Search
CPC ........ B24B 37/015; B24B 49/14; B24B 55/02; B24B 55/03; B24B 37/34
USPC ............... 451/7, 53, 449, 488; 137/339, 89; 222/146.2, 146.5
See application file for complete search history.

(56) References Cited

U.S. PATENT DOCUMENTS

| | | | | |
|---|---|---|---|---|
| 5,885,134 A * | 3/1999 | Shibata | ................. | B24B 37/005 137/312 |
| 6,000,997 A * | 12/1999 | Kao et al. | .......................... | 451/7 |
| 6,012,967 A * | 1/2000 | Satake et al. | .................... | 451/36 |
| 6,099,662 A * | 8/2000 | Wang et al. | ...................... | 134/26 |
| 6,416,384 B1 * | 7/2002 | Kawamoto | ........... | B24B 37/015 257/E21.237 |
| 6,482,732 B1 * | 11/2002 | Tokitoh | ................... | B24B 49/14 257/E21.304 |
| 6,544,111 B1 * | 4/2003 | Kimura | ................... | B24B 37/11 451/288 |
| 6,652,708 B2 | 11/2003 | Kneer | | |

(Continued)

FOREIGN PATENT DOCUMENTS

EP            1175964 A2 *    1/2002

*Primary Examiner* — Monica Carter
*Assistant Examiner* — Marcel Dion
(74) *Attorney, Agent, or Firm* — Cooper Legal Group, LLC

(57) ABSTRACT

Among other things, one or more systems and techniques for increasing temperature for chemical mechanical polishing (CMP) are provided. For example, a liquid heater component is configured to supply heated liquid to a polishing pad upon which a semiconductor wafer is to be polished, resulting in a heated polishing pad having a heated polishing pad temperature. The increased temperature of the heated polishing pad increases oxidation of the semiconductor wafer, which improves a CMP removal rate of material from the semiconductor wafer due to a decreased oxidation timespan and a stabilization timespan for reaching a stable CMP removal rate during CMP. In this way, the semiconductor wafer is polished utilizing the heated polishing pad, such as by a tungsten CMP process.

20 Claims, 6 Drawing Sheets

(56) References Cited

U.S. PATENT DOCUMENTS

| | | | | |
|---|---|---|---|---|
| 6,776,691 | B2* | 8/2004 | Nishimura | B08B 3/00 |
| | | | | 29/852 |
| 6,953,750 | B1 | 10/2005 | Wu et al. | |
| 7,335,088 | B1 | 2/2008 | Hwang et al. | |
| 7,883,393 | B2* | 2/2011 | Kordic et al. | 451/7 |
| 8,172,641 | B2* | 5/2012 | Ho et al. | 451/7 |
| 8,182,709 | B2 | 5/2012 | Heinrich et al. | |
| 2003/0186623 | A1* | 10/2003 | Pham et al. | 451/7 |
| 2007/0254558 | A1* | 11/2007 | Kodera | B24B 37/005 |
| | | | | 451/28 |
| 2010/0279435 | A1* | 11/2010 | Xu et al. | 438/5 |
| 2011/0159782 | A1* | 6/2011 | Sone et al. | 451/7 |
| 2011/0180512 | A1* | 7/2011 | Bosar et al. | 216/84 |
| 2014/0231010 | A1* | 8/2014 | Park | H01L 21/67075 |
| | | | | 156/345.11 |
| 2015/0024661 | A1* | 1/2015 | Peng | B24B 53/017 |
| | | | | 451/41 |

* cited by examiner

TEMPERATURE MODIFICATION FOR CHEMICAL MECHANICAL POLISHING

BACKGROUND

During fabrication of a semiconductor wafer, chemical mechanical polishing is performed to smooth surfaces of the semiconductor wafer using chemical and mechanical forces. For example, the semiconductor wafer is polished to prepare the semiconductor wafer for a new layer of material. In an example of polishing, the semiconductor wafer is secured to a polishing head configured to polish the semiconductor wafer against a polishing pad (e.g., vacuum pressure is used to secure the semiconductor wafer to the polishing head). The polishing head applies force to the semiconductor wafer toward the polishing pad during polishing. The polishing head rotates the semiconductor wafer against the polishing pad, which is also rotated, to apply mechanical force to the semiconductor wafer to remove material or even out irregular topography of the semiconductor wafer. In an example, chemicals are applied to the polishing pad during polishing to apply corrosive chemical force to the semiconductor wafer to aid in polishing.

DETAILED DESCRIPTION

Figure 1:
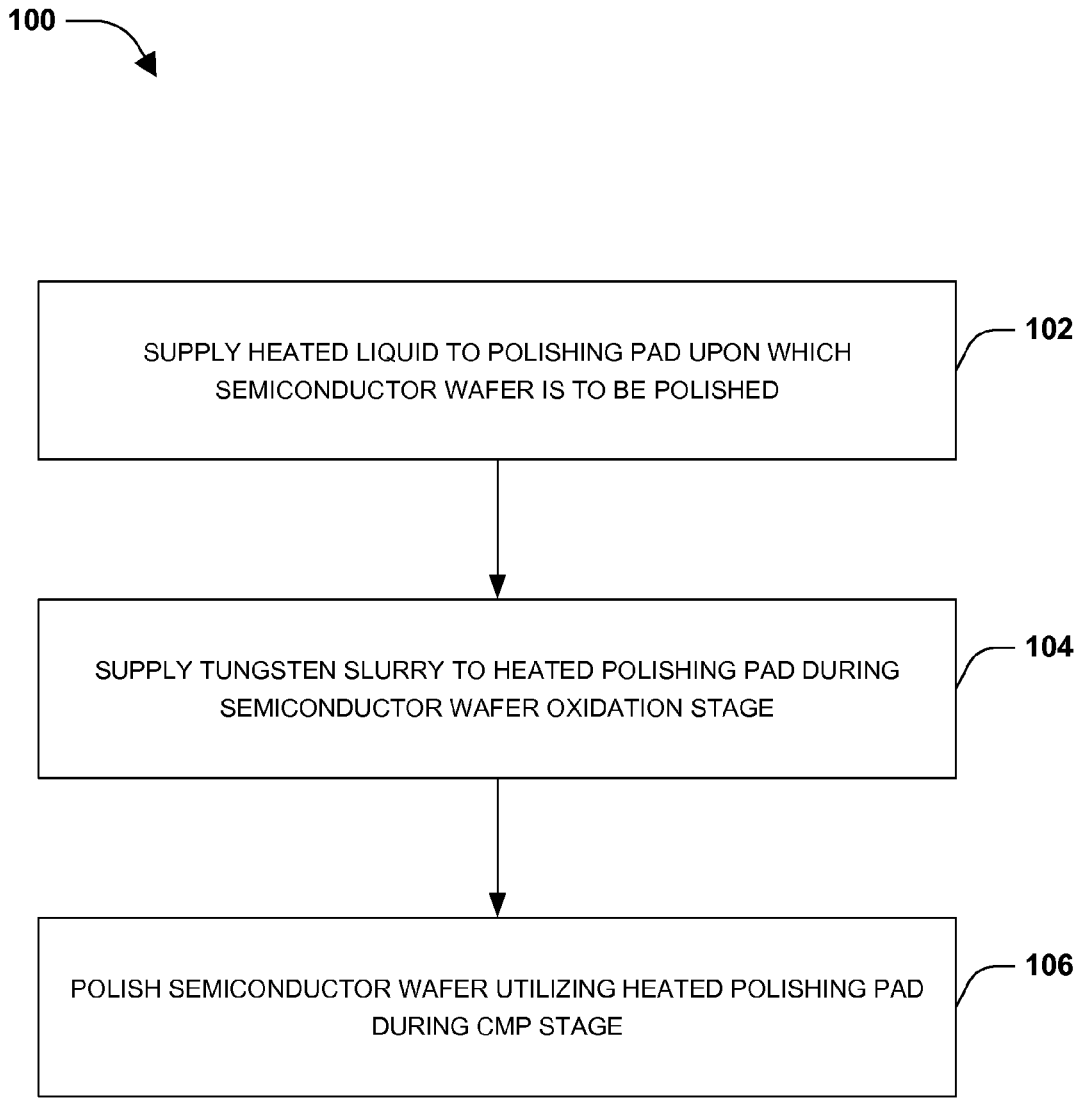
FIG. 1 is a flow diagram illustrating a method of increasing temperature for chemical mechanical polishing, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more systems and techniques for increasing temperature for chemical mechanical polishing (CMP) are provided herein. In an example, heated liquid, such as deionized water supplied by a deionized water component and heated to a temperature between about 60° C. to about 70° C., is supplied to a polishing pad upon which a semiconductor wafer is to be polished to generate a heated polishing pad having a heated polishing pad temperature such as a temperature above 45° C. Because chemical reactions associated with oxidation are affected by temperature increases, the increased temperature of the heated polishing pad increases a rate of oxidation of the semiconductor wafer during a semiconductor wafer oxidation stage, such as oxidation resulting from application of a tungsten slurry and an oxidizer such as $H_2O_2$. Because the rate of oxidation of the semiconductor wafer is increased, a timespan of the semiconductor wafer oxidation stage is decreased. A CMP removal rate of material is a function of oxidation of the semiconductor wafer. Accordingly, because the timespan of the oxidation stage is decreased, a CMP stage begins sooner and a CMP removal rate of material from the semiconductor wafer is improved, such as a 22% improvement or an increase in material removed from about 5642 A/min to about 6892 A/min or greater. That is, because of the faster oxidation of the semiconductor wafer, the CMP removal rate is improved because an amount of time to reach a stable rate of material removal at a desired material removal rate is decreased, given that the CMP removal rate is a function of the oxidation of the semiconductor wafer. Because the CMP removal rate improved, a duration of the CMP stage is reduced, and thus relatively less tungsten slurry is used during CMP, such as a 16% slurry reduction.

A method 100 of increasing temperature for CMP is illustrated in FIG. 1. At 102, heated liquid is supplied to a polishing pad upon which a semiconductor wafer is to be polished to generate a heated polishing pad having a heated polishing pad temperature. In an example, the heated polishing pad temperature is about 45° C. or greater such as about 58° C. In an example, the heated liquid is supplied at a temperature above an ambient temperature, such as an ambient temperature associated with a polishing component comprising the polishing pad. In an example, the heated liquid is supplied at a temperature between about 60° C. to about 70° C. In an example, the heated liquid is supplied for a timespan between about 6 seconds to about 12 seconds. In an example, the heated liquid is supplied during a polishing pad conditioning stage before a CMP stage. During the polishing pad conditioning stage, an abrasive structure, such as a diamond disk, is applied to the polishing pad to modify a polishing pad surface of the polishing pad, such as increasing an abrasiveness or roughness of the polishing pad surface. In an example, the heated liquid comprises deionized water. In an example, the heated liquid is supplied during a cleaning stage prior to a CMP stage to clean the polishing pad.

At 104, a tungsten slurry is supplied to the heated polishing pad during a semiconductor wafer oxidation stage to generate an oxidized semiconductor wafer. In an example, at least one of the tungsten slurry, an oxidizer such as $H_2O_2$, or an abrasive particle are supplied to the polishing pad during the semiconductor wafer oxidation stage. The oxidizer and the tungsten slurry react, such as at a faster rate due to the heated polishing pad temperature, to oxidize the semiconductor wafer. Because an increase in temperature increases a rate of oxidation, a timespan of the semiconductor wafer oxidation stage is reduced due to the heated polishing pad temperature of the heated polishing pad, such as an increased temperature from an ambient temperature of about 25° C. to the heated polishing pad temperature of about 45° C. or greater such as about 58° C. In an example, the heated liquid is supplied before the semiconductor wafer oxidation stage. In another example, the heated liquid is supplied during the semiconductor wafer oxidation stage.

At 106, the semiconductor wafer is polished utilizing the heated polishing pad during a CMP stage after the oxidation stage. For example, a tungsten slurry is supplied to the heated polishing pad. A polishing head down force is applied to the polishing head to which the semiconductor wafer is attached. The polishing head down force applies a force upon the semiconductor wafer towards the heated polishing pad during the CMP stage. In an example, the heated polishing pad is rotated against the semiconductor wafer during the CMP stage. In an example, the polishing head is rotated to rotate the semiconductor wafer against the heated polishing pad. In this way, the semiconductor wafer is polished to remove material or smooth a surface of the semiconductor wafer in a relatively shorter timespan because a timespan of semiconductor wafer oxidation stage is decreased such that a removal rate of material from the semiconductor wafer is stabilized at a desired rate quicker than if the polishing pad was not heated.

Figure 2:
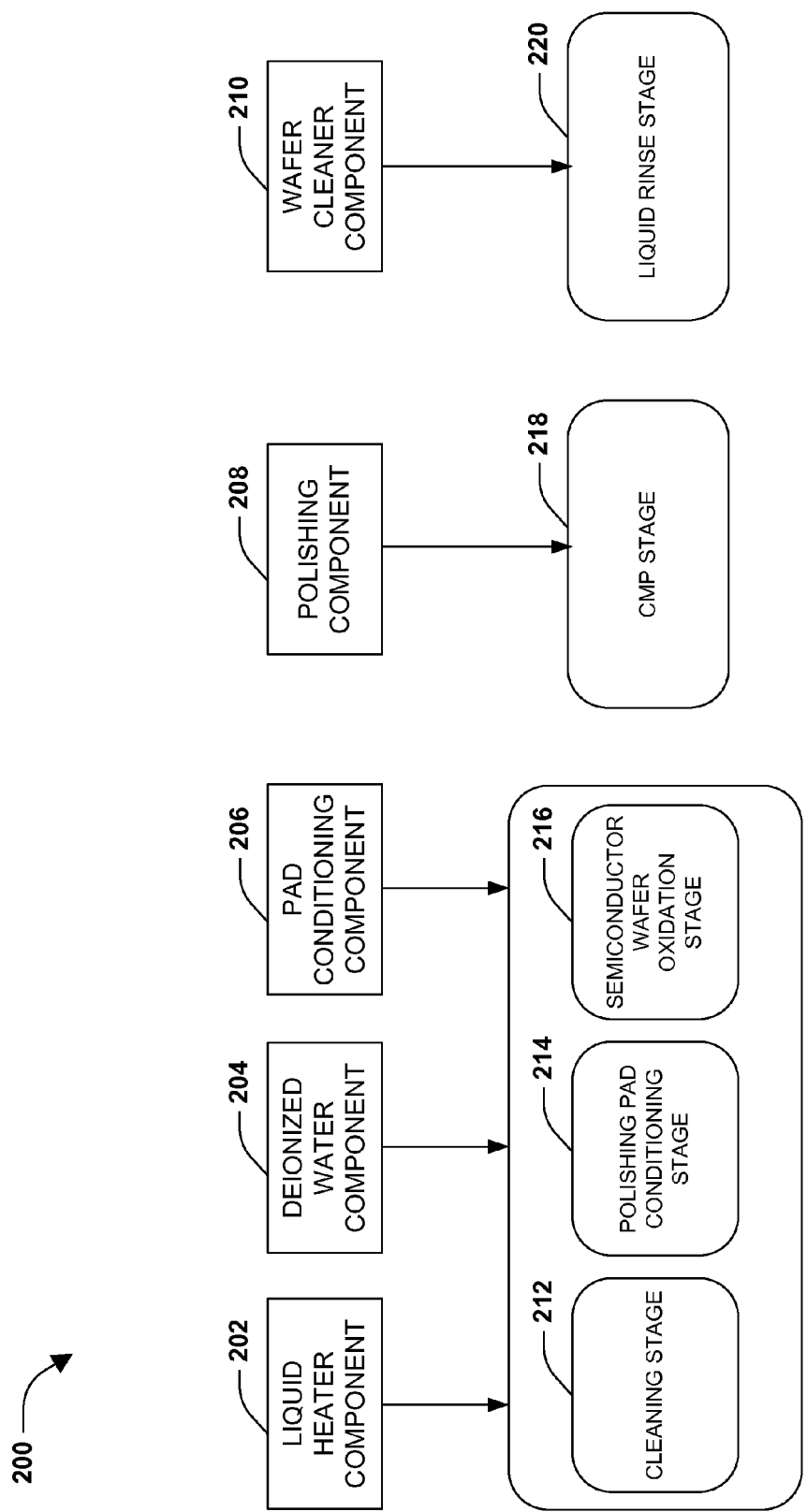
FIG. 2 is an illustration of a system for increasing temperature for chemical mechanical polishing, according to some embodiments.

FIG. 2 illustrates a system 200 for increasing temperature for CMP. The system 200 comprises at least one of a liquid heater component 202, a deionized water component 204, a pad conditioning component 206, a polishing component 208, or a wafer cleaner component 210. The system 200 is configured to perform CMP upon a semiconductor wafer during one or more stages, such as at least one of a cleaning stage 212, a polishing pad conditioning stage 214, a semiconductor wafer oxidation stage 216, a CMP stage 218, or a liquid rinse stage 220. In an example, respective stages are performed sequentially. In another example, one or more stages are performed concurrently, such as the cleaning stage 212, the polishing pad conditioning stage 214, and the semiconductor wafer oxidation stage 216, or the semiconductor wafer oxidation stage 216 and the CMP stage 218.

During the cleaning stage 212, the liquid heater component 202 is configured to supply heated liquid to a polishing pad upon which a semiconductor wafer is to be polished in order to clean the polishing pad for polishing of the semiconductor wafer. In an example, the liquid heater component 202 is operatively coupled to the deionized water component 204, such that the liquid heater component 202 is configured to heat deionized water, supplied by the deionized water component 204, to generate the heated liquid. The heated liquid is used to remove particles or contaminants resulting from a previous CMP of a previously polished semiconductor wafer. In this way, the polishing pad is cleaned in preparation for polishing the semiconductor wafer.

During the polishing pad conditioning stage 214, the pad conditioning component 206 is configured to apply an abrasive structure to the polishing pad in order to modify a polishing pad surface of the polishing pad, such as increasing a roughness or abrasiveness of the polishing pad surface. In an example, the liquid heater component 202 is configured to supply heated liquid, such as at a temperature between about 60° C. to about 70° C. for between about 6 seconds to about 12 seconds, to the polishing pad during the polishing pad conditioning stage 214 to generate a heated polishing pad having a heated polishing pad temperature, such as a temperature greater than about 45° C. Increasing the temperature of the polishing pad to the heated polishing pad temperature increases a rate of oxidation that occurs during the semiconductor wafer oxidation stage 216. Increasing a rate of oxidation decreases a timespan of the semiconductor wafer oxidation stage 216, resulting in a decreased amount of time to stabilize a CMP removal rate of material from the semiconductor wafer during CMP. In this way, the CMP removal rate is improved, such as from about 5642 A/min at 23° C. to about 6892 A/min at 45° C., and CMP time is thereby decreased. During the semiconductor wafer oxidation stage 216, at least one of a tungsten slurry, an oxidizer such as $H_2O_2$, or an abrasive particle is supplied to the heated polishing pad to facilitate oxidation of the semiconductor wafer to generate an oxidized semiconductor wafer.

The polishing component 208 is configured to polish the oxidized semiconductor wafer during the CMP stage 218. For example, tungsten slurry is supplied to the heated polishing pad. A polishing head down force is applied to the polishing head to which the oxidized semiconductor wafer is attached. The polishing head down force applies a force upon the semiconductor wafer towards the heated polishing pad. The heated polishing pad is rotated against the semiconductor wafer. The polishing head is rotated to rotate the semiconductor wafer against the heated polishing pad. In this way, the oxidized semiconductor wafer is polished during the CMP stage 218. Upon completion of the CMP stage 218, the wafer cleaner component 210 is configured to clean the polished semiconductor wafer during the liquid rinse stage 220. For example, a cleaning liquid, having a temperature less than a temperature of the heated liquid, in an example, is applied to the polished semiconductor wafer to clean the polished semiconductor wafer of particles remaining from the CMP stage 218.

Figure 3:
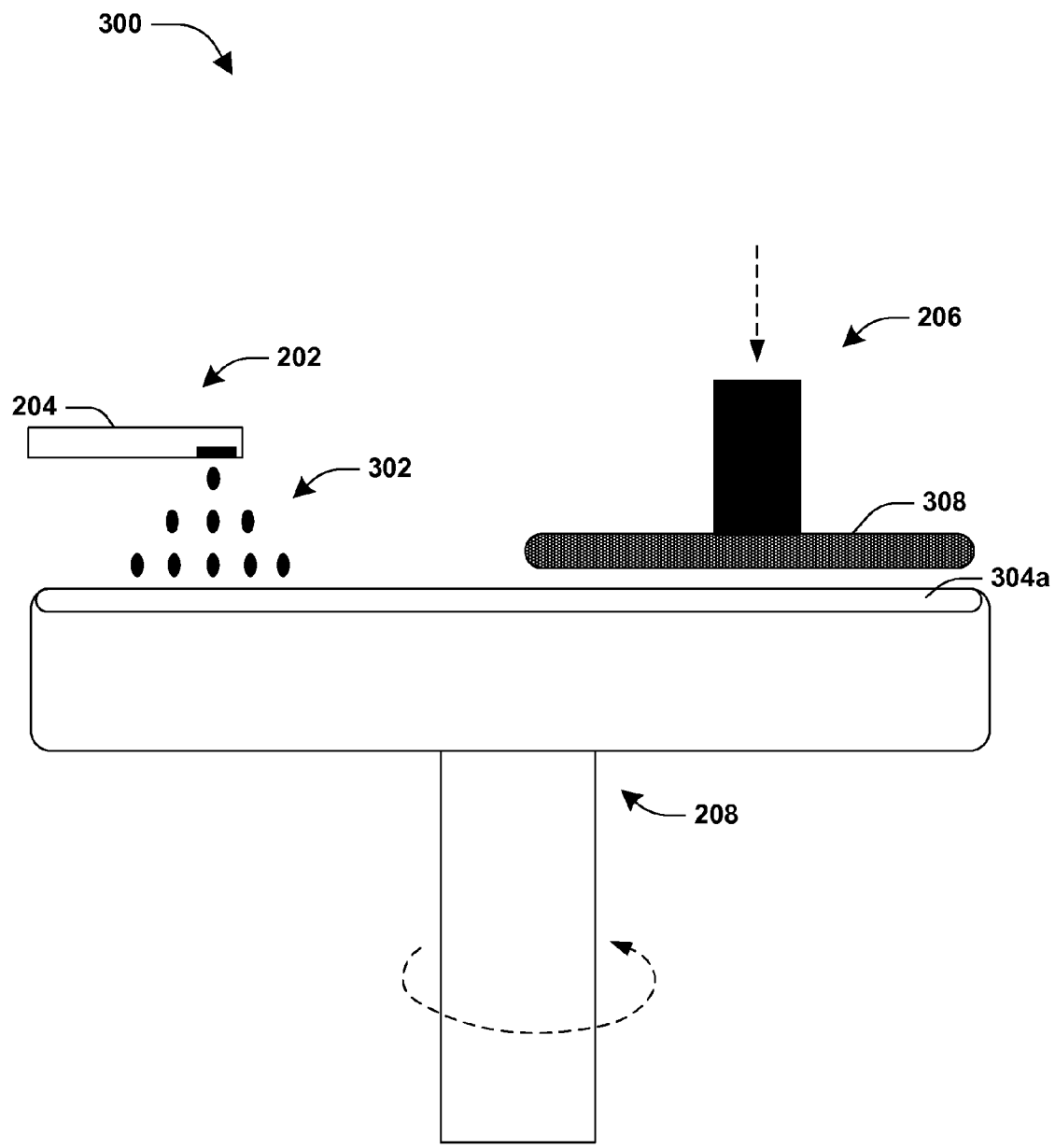
FIG. 3 is an illustration of a system for heating a polishing pad to a heated polishing pad temperature, according to some embodiments.

FIG. 3 illustrates a system 300 for heating a polishing pad to a heated polishing pad temperature. The system 300 comprises a liquid heater component 202, a deionized water component 204, a polishing component 208, and a pad conditioning component 206. The polishing component 208 comprises a polishing pad 304a upon which a semiconductor wafer is to be polished by the polishing component 208. The pad conditioning component 206 comprises an abrasive structure 308, such as a diamond disk, used to modify a polishing pad surface of the polishing pad 304a. For example, the polishing pad surface is roughened by the abrasive structure 308, resulting in a modified polishing pad 304b illustrated in FIG. 4. The liquid heater component 202 is operatively coupled to the deionized water component 204. The liquid heater component 202 is configured to heat deionized water, supplied by the deionized water component 204, to generate heated liquid 302. In an example, the heated liquid 302 has a temperature between about 60° C. to about 70° C., and is supplied for a timespan between about 6 seconds to about 12 seconds. The heated liquid 302 is supplied to the polishing pad 304a to increase a temperature of the polishing pad 304a to a heated polishing pad temperature, resulting in modified polishing pad 304b illustrated in FIG. 4. For example, the heated polishing pad temperature comprises a temperature of about 45° C. or greater, such as about 58° C. or greater.

Figure 4:
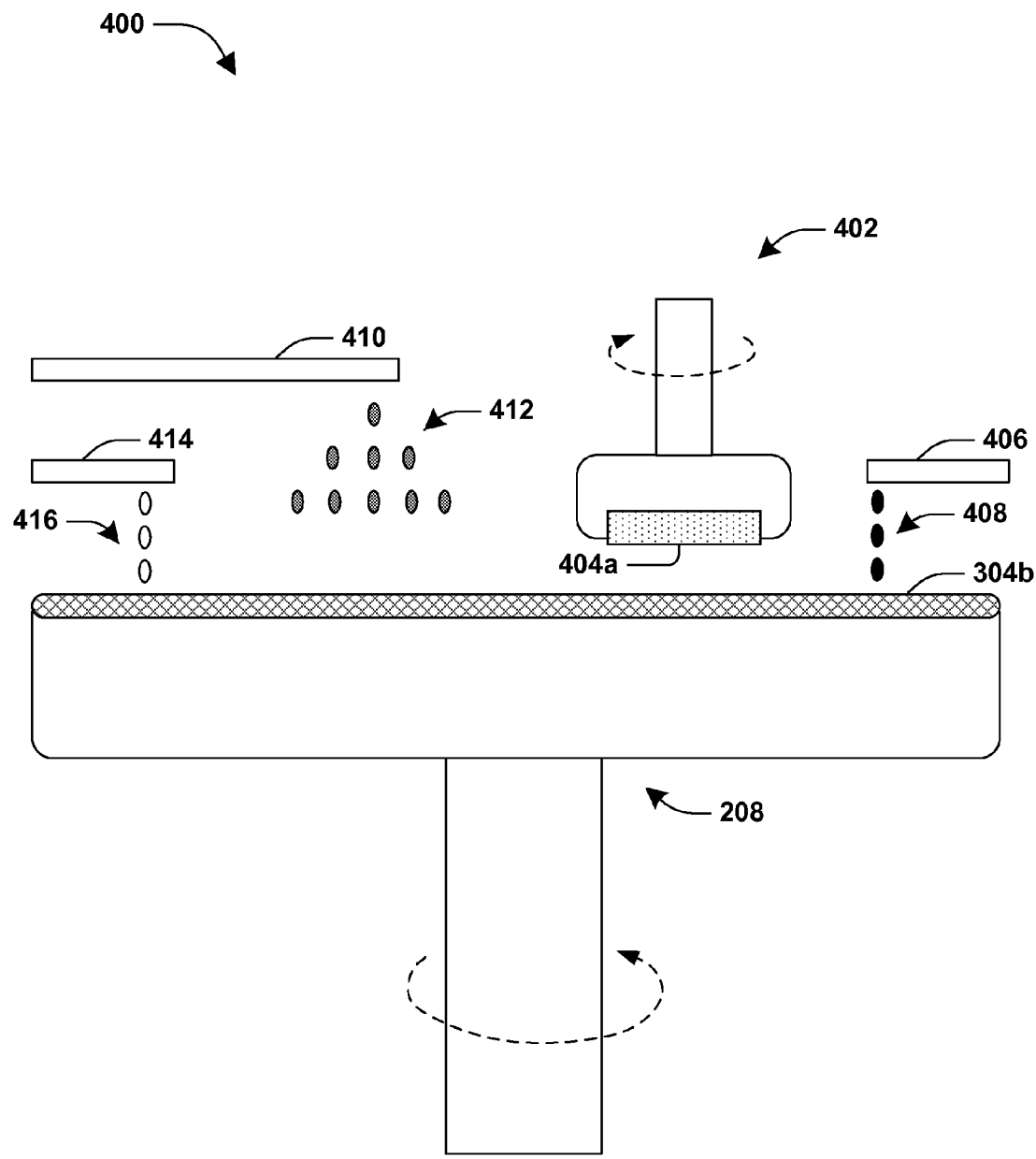
FIG. 4 is an illustration of a system for oxidizing a semiconductor wafer, according to some embodiments.

FIG. 4 illustrates a system 400 for oxidizing a semiconductor wafer 404a. The system 400 comprises a polishing component 208, a slurry component 406, an abrasive particle component 410, and an oxidizer component 414. The polishing component 208 comprises a polishing head 402 upon which the semiconductor wafer 404a is attached, such as by vacuum. In an example, the polishing component 208 comprises a modified polishing pad 304b corresponding to polishing pad 304a illustrated in FIG. 3. That is, the modified polishing pad 304b corresponds to a heated polishing pad having a heated polishing pad temperature, such as a temperature above 45° C., and comprises a polishing pad surface roughened by an abrasive structure 308, as illustrated in FIG. 3. During a semiconductor wafer oxidation stage, the slurry component 406 is configured to supply a tungsten slurry 408 to the modified polishing pad 304b for oxidation of the semiconductor wafer 404a. The oxidizer component 414 is configured to supply an oxidizer 416, such as $H_2O_2$, to the modified polishing pad 304b for oxidation of the semiconductor wafer 404a. The abrasive particle component 410 is configured to supply an abrasive particle 412 to the modified polishing pad 304b to aid in mechanical abrasion of the semiconductor wafer 404a during polishing. In this way, the semiconductor wafer is oxidized to create an oxidized semiconductor wafer 404b illustrated in FIG. 5.

Figure 5:
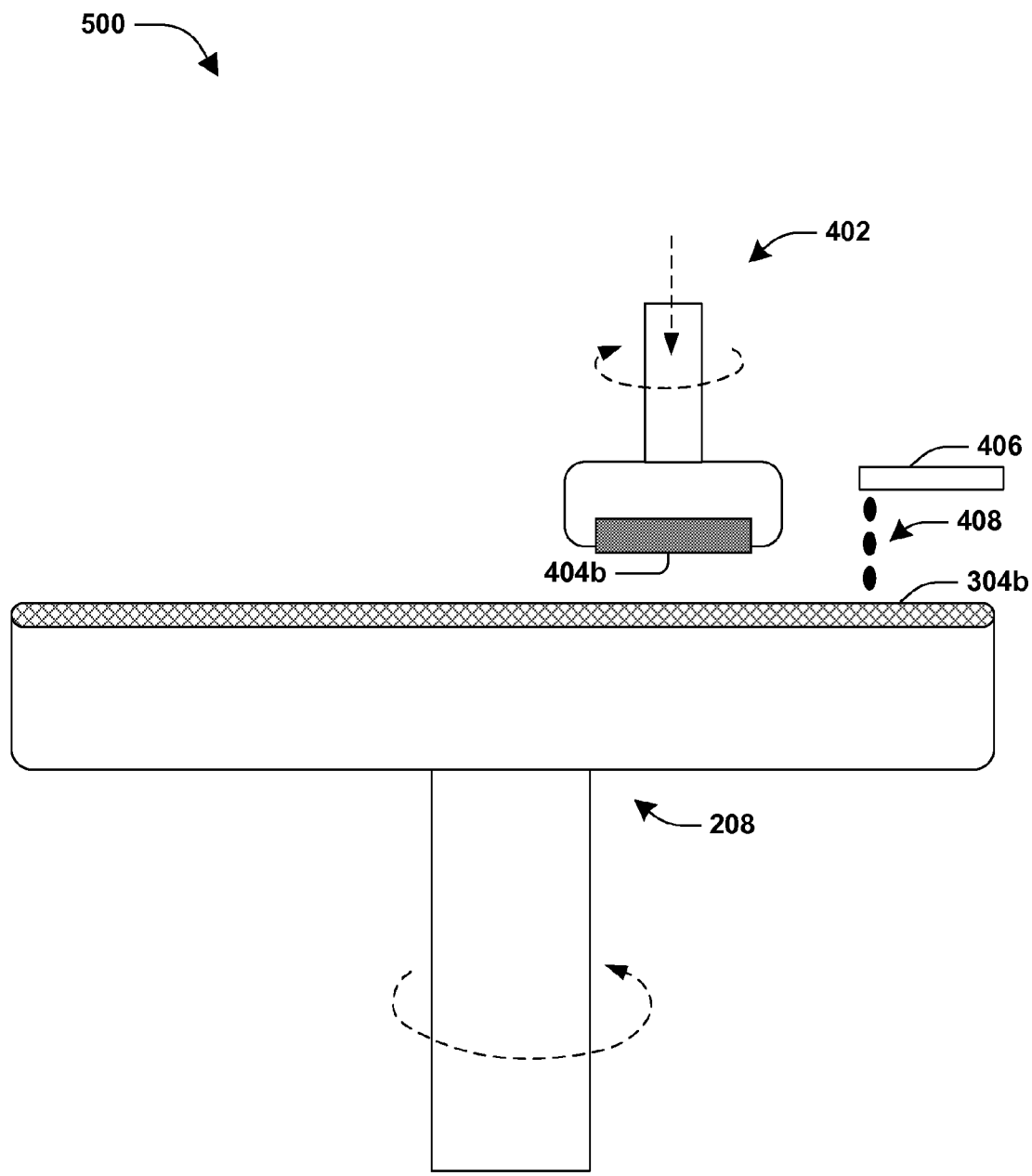
FIG. 5 is an illustration of a system for polishing an oxidized semiconductor wafer during a CMP stage, according to some embodiments.

FIG. 5 illustrates a system 500 for polishing an oxidized semiconductor wafer 404b during a CMP stage. The system 500 comprises a polishing component 208 and a slurry component 406. The polishing component 208 comprises a polishing head 402 upon which the oxidized semiconductor wafer 404b is attached. The polishing component 208 is configured to apply a polishing head down force to the polishing head 402. The polishing head down force applies a force upon the oxidized semiconductor wafer towards the modified polishing pad 304b. The polishing component 208 is configured to rotate the polishing head 402 to rotate the oxidized semiconductor wafer 404b against the modified polishing pad 304b. The polishing component 208 is configured to rotate the modified polishing pad 304b against the oxidized semiconductor wafer 404b. In this way, mechanical force is used to polish the oxidized semiconductor wafer 404b. The slurry component 406 is configured to supply a tungsten slurry 408 to the modified polishing pad 304b to apply chemical force to polish the oxidized semiconductor wafer 404b. In this way, the oxidized semiconductor wafer 404b is polished by mechanical and chemical forces, resulting in a polished semiconductor wafer. Because the heated polishing pad temperature of the modified polishing pad 304b facilitated oxidation associated with the oxidized semiconductor wafer 404b, a CMP removal rate of material during polishing is improved due to a decreased time to reach a stable removal rate that resulted from the increased temperature. In an example, a reduced amount of tungsten slurry 408, such as about a 22% reduction, is used during the CMP stage because of the improved CMP removal rate. In another example, a timespan of the CMP stage is decreased, such as to about 90 seconds, because of the improved CMP removal rate. Once polished, the polished semiconductor wafer is cleaned using a cleaning liquid to remove particles from the polished semiconductor wafer. For example, the cleaning liquid has a temperature less than a temperature of the heated liquid, and the cleaning liquid is applied for about 10 seconds.

Figure 6:
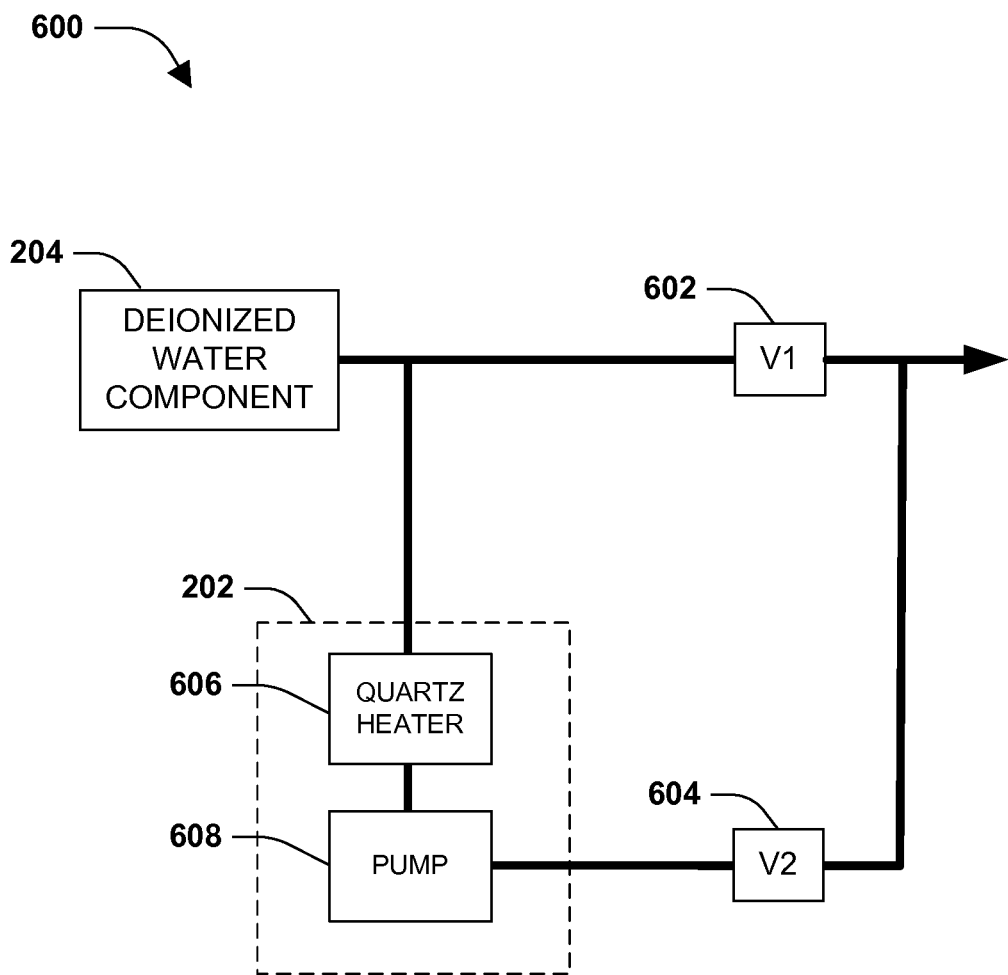
FIG. 6 is an illustration of a liquid heater component, according to some embodiments.

FIG. 6 illustrates an example 600 of a liquid heater component 202. The liquid heater component 202 is operatively coupled to a deionized water component 204. The deionized water component 204 is configured to supply deionized water to a polishing component, such as a polishing pad of the polishing component, through a first valve 602. The liquid heater component 202 comprises a heating device, such as a quartz heater 606, configured to heat deionized water, supplied by the deionized water component 204, as heated liquid. The liquid heater component 202 comprises a pump 608 configured to supply the heated liquid through a second valve 604 to the polishing component, such as the polishing pad of the polishing component. In this way, one or more of heated liquid or deionized water is supplied to the polishing component.

According to an aspect of the instant disclosure, a system for increasing temperature for chemical mechanical processing (CMP) is provided. The system comprises a liquid heater component configured to supply heated liquid to a polishing pad upon which a semiconductor wafer is to be polished to generate a heated polishing pad having a heated polishing pad temperature. The system comprises a polishing component configured to polish the semiconductor wafer utilizing the heated polishing pad during a CMP stage. For example, the polishing component polishes the semiconductor wafer responsive to the heating polishing pad temperature exceeding a threshold.

According to an aspect of the instant disclosure, a method for increasing temperature for chemical mechanical processing (CMP) is provided. The method comprises supplying heated liquid to a polishing pad upon which a semiconductor wafer is to be polished to generate a heated polishing pad having a heated polishing pad temperature. A tungsten slurry is supplied to the heated polishing pad during a semiconductor wafer oxidations stage to generate an oxidized semiconductor wafer. The oxidized semiconductor wafer is polished utilizing the heated polishing pad during a CMP stage after the oxidation stage.

According to an aspect of the instant disclosure, a system for increasing temperature for chemical mechanical processing (CMP) is provided. The system comprises a liquid heater component configured to supply heated deionized water to a polishing pad upon which a semiconductor wafer is to be polished to generate a heated polishing pad having a heated polishing pad temperature. The system comprises a polishing component configured to supply a tungsten slurry to the heated polishing pad during a semiconductor wafer oxidation stage to generate an oxidized semiconductor wafer. The polishing component is configured to polish the oxidized semiconductor wafer utilizing the heated polishing pad during a CMP stage after the oxidations stage.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system, comprising:
a fluid reservoir for storing a liquid;
a nozzle for dispensing the liquid onto a polishing pad of a chemical mechanical polishing (CMP) system;
a first fluid pathway from the fluid reservoir to the nozzle;
a second fluid pathway from the fluid reservoir to the nozzle;
a first valve disposed within the first fluid pathway;
a second valve disposed within the second fluid pathway;
a liquid heater component disposed within the second fluid pathway between the fluid reservoir and the second valve, the liquid heater component comprising a quartz heater configured to heat the liquid to generate heated liquid, wherein the heated liquid is supplied to the polishing pad upon which a semiconductor wafer is to be polished to generate a heated polishing pad having a heated polishing pad temperature; and
a polishing component configured to:
responsive to the heated polishing pad temperature exceeding a threshold, polish the semiconductor wafer utilizing the heated polishing pad during a CMP stage.

2. The system of claim 1, the threshold greater than an ambient temperature associated with the polishing component.

3. The system of claim 1, the heated liquid comprising a temperature between about 60° C. to about 70° C.

4. The system of claim 1, the polishing component comprising:
a pad conditioning component configured to modify a polishing pad surface of at least one of the polishing pad or the heated polishing pad during a polishing pad conditioning stage before the CMP stage.

5. The system of claim 4, the liquid heater component configured to:
supply the heated liquid during the polishing pad conditioning stage through the nozzle while the second valve is opened.

6. The system of claim 1, the polishing component configured to:
supply a slurry to the heated polishing pad during the CMP stage.

7. The system of claim 1, the heated polishing pad temperature greater than about 45° C.

8. The system of claim 1, the liquid heater component configured to supply the heated liquid for a timespan between about 6 seconds to about 12 seconds.

9. The system of claim 1, comprising:
a wafer cleaner component configured to:
responsive to completion of the CMP stage, open the first valve to apply a liquid rinse to the semiconductor wafer through the nozzle utilizing the liquid.

10. The system of claim 1, the polishing component configured to:
supply a slurry to the heated polishing pad during the CMP stage;
apply a polishing head down force to a polishing head to which the semiconductor wafer is attached, the polishing head down force applying a force upon the semiconductor wafer towards the heated polishing pad during the CMP stage;
rotate the heated polishing pad against the semiconductor wafer during the CMP stage; and
rotate the polishing head to rotate the semiconductor wafer against the heated polishing pad during the CMP stage.

11. The system of claim 1, wherein the liquid is deionized water.

12. The system of claim 1, the liquid heater component configured to:
supply the heated liquid during a cleaning stage prior to the CMP stage through the nozzle while the second valve is opened.

13. The system of claim 1, the polishing component configured to:
supply at least one of a slurry, an oxidizer, or an abrasive particle to the heated polishing pad during a semiconductor wafer oxidation stage.

14. A system for increasing temperature for chemical mechanical polishing (CMP), comprising:
an abrasive structure configured to:
roughen a surface of a polishing pad upon which a semiconductor wafer is to be polished;
a first fluid pathway from a fluid reservoir to a nozzle for dispensing a liquid stored in the fluid reservoir onto the polishing pad;
a second fluid pathway from the fluid reservoir to the nozzle;
a first valve disposed within the first fluid pathway;
a second valve disposed within the second fluid pathway;
a liquid heater component disposed within the second fluid pathway between the fluid reservoir and the second valve and configured to:
heat the liquid to generate heated liquid that is supplied to the polishing pad concurrently with the abrasive structure roughening the surface of the polishing pad to generate a heated polishing pad having a heated polishing pad temperature and that is supplied to the heated polishing pad concurrently with supplying an oxidizer to the heated polishing pad to generated an oxidized semiconductor wafer; and
a polishing component configured to:

polish the oxidized semiconductor wafer utilizing the heated polishing pad.

15. A system, comprising:
a fluid reservoir for storing a liquid;
a nozzle for dispensing the liquid onto a polishing pad of a chemical mechanical polishing (CMP) system;
a first fluid pathway from the fluid reservoir to the nozzle;
a second fluid pathway from the fluid reservoir to the nozzle;
a first valve disposed within the first fluid pathway;
a second valve disposed within the second fluid pathway;
a liquid heater component disposed within the second fluid pathway between the fluid reservoir and the second valve and configured to heat the liquid to generate heated liquid, wherein the heated liquid is supplied to the polishing pad upon which a semiconductor wafer is to be polished to generate a heated polishing pad having a heated polishing pad temperature; and
a polishing component configured to:
responsive to the heated polishing pad temperature exceeding a threshold, polish the semiconductor wafer utilizing the heated polishing pad during a CMP stage.

16. The system of claim 15, the polishing component comprising:
a pad conditioning component configured to modify a polishing pad surface of at least one of the polishing pad or the heated polishing pad during a polishing pad conditioning stage before the CMP stage.

17. The system of claim 16, the liquid heater component configured to:
supply the heated liquid during the polishing pad conditioning stage through the nozzle while the second valve is opened.

18. The system of claim 15, the polishing component configured to:
supply a slurry to the heated polishing pad during the CMP stage;
apply a polishing head down force to a polishing head to which the semiconductor wafer is attached, the polishing head down force applying a force upon the semiconductor wafer towards the heated polishing pad during the CMP stage;
rotate the heated polishing pad against the semiconductor wafer during the CMP stage; and
rotate the polishing head to rotate the semiconductor wafer against the heated polishing pad during the CMP stage.

19. The system of claim 15, wherein the liquid is deionized water.

20. The system of claim 15, the liquid heater component configured to:
supply the heated liquid during a cleaning stage prior to the CMP stage through the nozzle while the second valve is opened.

* * * * *